US012586628B2

(12) United States Patent
Fujiwara et al.

(10) Patent No.: US 12,586,628 B2
(45) Date of Patent: Mar. 24, 2026

(54) ADJUSTING PULSE WIDTH BASED ON ADDRESS SIGNAL IN MEMORY DEVICES

(71) Applicant: Taiwan Semiconductor Manufacturing Company, Ltd., Hsinchu (TW)

(72) Inventors: Hidehiro Fujiwara, Hsinchu City (TW); Yi-Hsin Nien, Hsinchu City (TW); Venkateswara Reddy Konudula, Hsinchu City (TW); Nikhil Puri, Hsinchu City (TW); Yen-Huei Chen, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 131 days.

(21) Appl. No.: 18/402,107

(22) Filed: Jan. 2, 2024

(65) Prior Publication Data

US 2025/0124966 A1     Apr. 17, 2025

Related U.S. Application Data

(60) Provisional application No. 63/590,142, filed on Oct. 13, 2023.

(51) Int. Cl.
    *G11C 8/08*     (2006.01)
    *G11C 11/4072*     (2006.01)
    (Continued)

(52) U.S. Cl.
    CPC ............ *G11C 11/4076* (2013.01); *G11C 8/08* (2013.01); *G11C 11/4072* (2013.01);
    (Continued)

(58) Field of Classification Search
    CPC ........... G11C 8/18; G11C 8/08; G11C 11/412; G11C 11/413; G11C 11/419; G11C 7/12; G11C 7/227; H03K 19/01742
    See application file for complete search history.

(56) References Cited

U.S. PATENT DOCUMENTS

| | | | |
|---|---|---|---|
| 9,111,595 B2 * | 8/2015 | Hsu | ........................ G11C 7/06 |
| 11,727,972 B2 * | 8/2023 | Huang | ............. H03K 19/01742 |
| | | | 365/230.06 |

(Continued)

FOREIGN PATENT DOCUMENTS

TW      201839761 A     11/2018

OTHER PUBLICATIONS

Office Action issued in connection with Taiwan Appl. No. 113107913 dated Oct. 30, 2024.

*Primary Examiner* — Mushfique Siddique
(74) *Attorney, Agent, or Firm* — Foley & Lardner LLP

(57) ABSTRACT

A memory device includes a memory array including a plurality of word lines, each of the plurality of word lines operatively coupled to a corresponding set of memory cells, and a controller operatively coupled to the memory array. The controller is configured to receive a first address signal indicating a first word line that is physically arranged with respect to the controller by a first distance, assert the first word line through a first signal with a first pulse width, receive a second address signal indicating a second word line that is physically arranged with respect to the controller by a second distance, assert the second word line through a second signal with a second pulse width, and adjust one of the first pulse width or the second pulse width based on the first distance and the second distance.

20 Claims, 9 Drawing Sheets

(51) Int. Cl.

| | |
|---|---|
| *G11C 11/4076* | (2006.01) |
| *G11C 11/408* | (2006.01) |
| *G11C 11/418* | (2006.01) |
| *G11C 11/419* | (2006.01) |
| *G11C 11/412* | (2006.01) |
| *G11C 11/413* | (2006.01) |

(52) U.S. Cl.
CPC ........ *G11C 11/4085* (2013.01); *G11C 11/418* (2013.01); *G11C 11/419* (2013.01); *G11C 11/412* (2013.01); *G11C 11/413* (2013.01)

(56) References Cited

U.S. PATENT DOCUMENTS

| | | | | |
|---|---|---|---|---|
| 2013/0194860 A1* | 8/2013 | Cheng | ................... | G11C 7/227 365/189.011 |
| 2013/0329505 A1* | 12/2013 | Yang | ...................... | G11C 7/227 365/189.11 |
| 2014/0119101 A1* | 5/2014 | Wang | ................... | G11C 16/04 365/154 |
| 2014/0307502 A1* | 10/2014 | Yang | ................... | G11C 11/413 365/189.11 |
| 2018/0151219 A1* | 5/2018 | Hsu | ........................ | G11C 7/227 |
| 2019/0392876 A1* | 12/2019 | Katoch | ................... | G11C 7/22 |
| 2022/0130344 A1* | 4/2022 | Li | ........................ | G11C 11/418 |
| 2023/0064595 A1* | 3/2023 | Huang | ............. | H03K 19/01742 |
| 2023/0197146 A1 | 6/2023 | Robert et al. | | |
| 2023/0326505 A1 | 10/2023 | Huang et al. | | |

\* cited by examiner

*200*

400

600

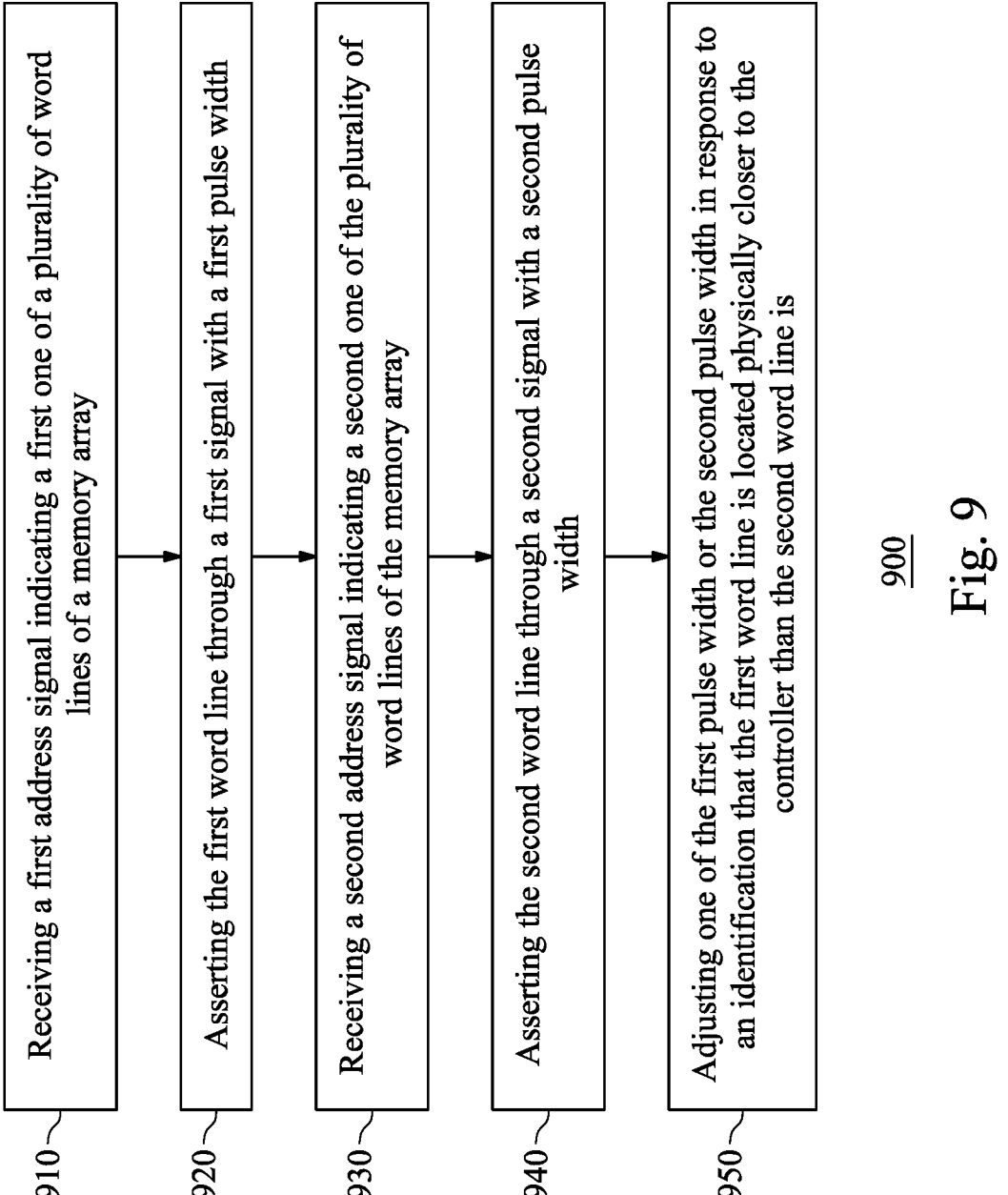

Receiving a first address signal indicating a first one of a plurality of word lines of a memory array Asserting the first word line through a first signal with a first pulse width Receiving a second address signal indicating a second one of the plurality of word lines of the memory array Asserting the second word line through a second signal with a second pulse width Adjusting one of the first pulse width or the second pulse width in response to an identification that the first word line is located physically closer to the controller than the second word line is

ADJUSTING PULSE WIDTH BASED ON ADDRESS SIGNAL IN MEMORY DEVICES

CROSS-REFERENCE TO RELATED APPLICATION

This application claims priority to and the benefit of U.S. Provisional Application No. 63/590,142, filed Oct. 13, 2023, entitled "WL PULSE OPTIMIZATION TO BITCELL ARRAY WITH FLYING BL SCHEME," which is incorporated herein by reference in its entirety for all purposes.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 9 illustrates a flow chart of an example method for operating a memory device, in accordance with some embodiments.

DETAILED DESCRIPTION

Figure 1:
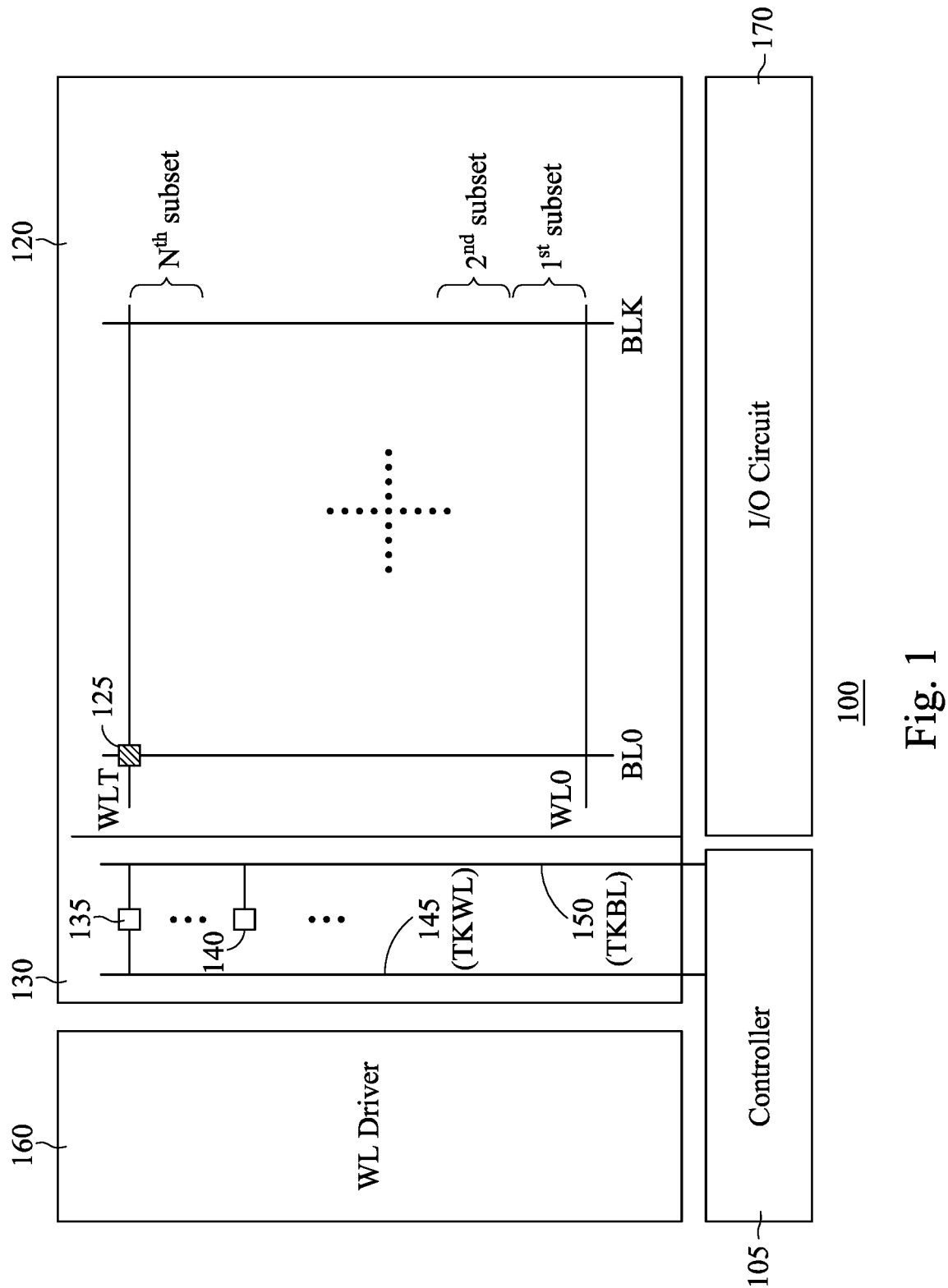
FIG. 1 illustrates a block diagram of a memory device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A static random access memory (SRAM) device is a type of volatile semiconductor memory that stores data bits using bistable circuitry that does not need refreshing. An SRAM cell may be referred to as a bit cell because it stores one bit of information, represented by the logic state of two cross coupled inverters. Memory arrays include multiple bit cells arranged in rows and columns. Each bit cell in a memory array typically includes connections to a power supply voltage and to a reference voltage. Logic signals on bit lines control reading from and writing to a bit cell, with a word line controlling connections of the bit lines to the inverters. A word line may be coupled to the bit cells in a row of a memory array, with different word lines provided for different rows.

Each successive bit cell along a bit line or word line has a characteristic input capacitance, and each conductor leg between bit cells has a resistance, leading to a signal propagation delay. The delay is longer for bit cells that are farther than others along signal paths beginning at the source of memory addressing and control signals, such as the outputs of address decoding gates and line drivers coupled at an edge of the memory array. The delay affects the time needed to access the bit cells and limits the highest frequency at which the memory can be operated. The time taken to access an SRAM bit cell, e.g., for a read/write operation, may vary due to several factors including the relative position of the accessed bit cell within the SRAM array. Reliable estimation of SRAM timing characteristics is important for ensuring consistency in system components and high system performance.

In this regard, various techniques have been proposed to provide timing tracking functionality for accurate, efficient monitoring of an SRAM device. Timing tracking enables determination of when a bit cell finishes a read or write operation. For example, a tracking bit line is typically enlisted from an existing bit line of a memory array to track or mimic the propagation time of a signal conducted through a normal bit line of the memory array. With the trend of ever increasingly shrunken feature size, the number of bit cells in a memory array increases accordingly, which causes each bit line to couple to an increasing number of word lines. In the existing technologies, all the word lines across the memory array share the same tracking scheme, e.g., the same tracking bit line. However, with the nearer word line sharing the same tracking timing with the farther word line (with respect to the beginning at a source of one or more control signals, e.g., a controller), a substantially significant amount of power is wasted for reading and/or programing the bit cells coupled to the nearer word lines. Thus, the existing timing tracking techniques or corresponding circuits for an SRAM device have not been entirely satisfactory in certain aspects.

The present disclosure provides various embodiments of a memory device including a controller and at least one memory array (including a number of bit cells) that are physically located next to and operatively coupled to each other. In various embodiments, the controller can adjust a pulse width of a word line signal based on how far an asserted word line is located from the controller. For example, the controller can receive an address signal that includes a plural number of bits, where one of the bits, when provided in a certain logic state, corresponds to a respective subset of word lines. Upon such a bit being configured in the logic state (which is configured to assert one of the word lines in the corresponding word line subset), the controller can adjust a pulse width of a corresponding word line signal (e.g., by adjusting a pulse width of a clock pulse). The subset of word lines located closer to the controller can be thereby asserted with a word line signal with a reduced pulse width, compared to the subset of word lines located farther from the controller. As such, the word line subset closer to the controller can be adaptively (or automatically) configured with a narrower word line pulse width, when compared to the farther word line subset. Therefore, undesired power consumption (when reading and/or programming the closer bit cells) can be advantageously avoided.

FIG. 1 illustrates a block diagram of a memory device 100, in accordance with various embodiments. The memory device 100 shown in FIG. 1 is simplified for illustration purposes, and thus, it should be appreciated that the memory device 100 can include any of various other components while remaining within the scope of the present disclosure.

As shown, the memory device 100 includes a memory controller 105 and a memory array 120. The memory array 120 may include a plurality of storage circuits or memory cells 125 arranged in two- or three-dimensional arrays. Each memory cell 125 may be coupled to one or more corresponding word lines (WLs) and one or more corresponding bit line (BLs). The memory controller 105 can write data to or read data from the memory array 120 according to electrical signals through word lines WL and bit lines BL. Further, according to various embodiments of the present disclosure, the memory controller 105 can adjust the pulse width of a WL signal conducted through a corresponding asserted word line WL based on a physical distance between the asserted word line and the memory controller 105, which will be discussed in further detail below. In other embodiments, the memory device 100 includes more, fewer, or different components than shown in FIG. 1.

The memory array 120 is a hardware component that stores data. In one aspect, the memory array 120 includes a plurality of storage circuits or memory cells 125. The memory array 120 includes word lines WL0 . . . WLJ, each extending in a first direction (e.g., X-direction) and bit lines BL0 . . . BLK, each extending in a second direction (e.g., Y-direction). In some embodiments, the memory array 120 may be referred to as having a number of columns and a number of rows, where each of the columns corresponds to a respective one of the bit lines BLs and each of the rows corresponds to a respective one of the word lines WLs. As shown, in some embodiments, the word lines may include a plurality of subsets, each of the plurality of subsets including one or more of word lines. That is, the memory array 120 can include K columns and J rows of the memory cells 125. The word lines WL and the bit lines BL may be conductive metals or conductive rails. Each memory cell 125 is coupled to a corresponding word line WL and a corresponding bit line BL, and can be operated according to voltages or currents through the corresponding word line WL and the corresponding bit line BL. In some embodiments, each bit line includes bit lines BL, BLB coupled to one or more memory cells 125 of a group of memory cells 125 disposed along the second direction (e.g., Y-direction). The bit lines BL, BLB may receive and/or provide differential signals. Each memory cell 125 may include a volatile memory, a non-volatile memory, or a combination of them. In some embodiments, each memory cell 125 is embodied as a static random access memory (SRAM) cell or other type of memory cell. In some embodiments, the memory array 120 includes additional lines (e.g., select lines, reference lines, reference control lines, power rails, etc.).

In addition to the memory cells 125 that are configured to store data (which are sometimes referred to as nominal memory cells), the memory array 120 may include one or more tracking columns 130 disposed next to or integrated into the memory array 120, as shown in FIG. 1. The tracking column 130 can each include a number of tracking cells 135 and a number of dummy cells 140. The tracking cells 135 and the dummy cells 140 may be configured in any respective numbers, with a total number of the tracking cells 135 and dummy cells 140 equal to the number of rows (J), while remaining within the scope of the present disclosure. For example, the number of tracking cells 135 may be selected to simulate a worst case condition in a write and/or read operation.

Further, the tracking column 130 can include at least one tracking word line 145 and at least one tracking bit line 150, in which the tracking word line 145 is connected to each of the tracking cells 135, and the tracking bit line 150 is connected to each of the tracking cells 135 and dummy cells 140. The tracking word line 145 and tracking bit line 150 are configured to conduct tracking signals TKWL and TKBL, respectively. By conducting the TKWL and TKBL signals, the tracking word line 145 and tracking bit line 150 can respectively emulate signal routing delays in a functional memory array (e.g., 120) for a read or write operation at the far edge. Further, according to various embodiments of the present disclosure, the memory controller 105 can adjust the pulse width of a tracking signal TKWL and/or TKBL conducted through a corresponding asserted word line WL and/or bit line BL based on a physical distance between the asserted line and the memory controller 105, which will be discussed in further detail below. In other embodiments, the memory device 100 includes more, fewer, or different components than shown in FIG. 1.

In some embodiments, the tracking word line 145 may include a (e.g., horizontal) portion extending along the rows of the memory array 120 (not expressly shown), and the (e.g., vertical) portion shown in FIG. 1 that extends along the columns of the memory array 120. A length of the vertical portion of the tracking word line 145 may be approximately equal to a height of the memory array (e.g., a distance from the memory controller 105 to the farthest tracking cell 135, according to the orientation of the memory array in FIG. 1); and a length of the horizontal portion of the tracking word line 145 may be approximately equal to a width of the memory array 120 (e.g., a distance along any of the rows from one edge of the array to the other, according to the orientation of the memory array in FIG. 1). Accordingly, a sum of the lengths of the first and second portions of the tracking word line 145 may be such that the metal routing delay for accessing a cell at the top right corner of the memory array 120 is emulated, e.g., the delay from signal entry at the bottom left, propagating horizontally and vertically, over a path distance equal to the length of a path from one corner to the diagonally opposite corner.

In general, the tracking cells 135 do not function as the (nominal) memory cells 125 do in terms of storing data and supporting read/write operations. Rather, the tracking cells 135 may originally be a subset of the nominal memory cells 125 but be enlisted, or re-purposed, for timing tracking. For example, the tracking cells 135 are bit cells with fixed logic values configured and coupled to one another so as to respond in a predictable way when addressed by test or tracking signals. The dummy cells 140 enable the capacitive and resistive environment to be matched closely for accurate modeling of the environment for nominal memory cells. Bit lines that are tracked typically have two factors that determine propagation delay of signals that are carried, namely serial resistance and parallel capacitance. The dummy cells 140 have real capacitive load, and mimic the capacitance of bit lines BLs coupled to the nominal memory cells. If the dummy cells 140 were not provided, the length of the tracking bit line would effectively appear to be shorter than the nominal bit lines BLs they are intended to emulate, which would decrease resistance and capacitance, and which might lead tracking circuitry to determine that read or write operations have concluded prematurely.

The memory controller 105 is a hardware component that is configured to control various operations of the memory array 120 such as, reading data bits from the memory cells 125, writing data bits into the memory cells 125, performing a tracking scheme on respective timings of the read/write operation, adjusting the tracking timings of the read/write operation, etc. In various embodiments, the memory controller 105 can include a number of circuits, each of which may be embodied as logic circuits, analog circuits, or a combination of them, to perform such operations.

For example, the memory controller 105 can include a clock generator, a pulse generator, and an adaptive tracking circuit. The clock generator can receive or generate a clock signal, and provide the clock signal for the pulse generator to generate a number of clock pulses. The pulse generator can rely on the clock pulses to control (e.g., pull up and/or down) a number of control signals (e.g., TKWL signals) conducted through the tracking word line. The adaptive tracking circuit can receive an address signal, which indicates at least one word line WL to be asserted. Based on the address signal indicating a physical position of the asserted word line, the adaptive tracking circuit can selectively adjust a timing of a number of control signals (e.g., TKBL signals) conducted through the tracking bit line. The selectively adjusted TKBL signal can be further received by the pulse generator, which causes the clock pulses to be adjusted. Such adjusted clock pulses can be configured to adjust (e.g., shorten) the pulse width of a WL signal conducted through the asserted word line WL inside the memory array 120.

In some embodiments, the memory device 100 can further include various other circuit components such as, for example, a word line driver/controller 160, an input/output (I/O) circuit 170, etc., each of which may be embodied as logic circuits, analog circuits, or a combination of them. The word line driver 160 can provide a voltage or current conducted through one or more word lines WL of the memory array 120. Such a voltage/current may sometimes be referred to as a WL signal. The controller 105 can utilize the adjusted clock pulses to adjust the pulse width of this WL signal (as briefly discussed above). The I/O circuit 170 can sense a voltage or current conducted through one or more bit lines BLs of the memory array 120. For example, the I/O circuit 170 may include a number of sense amplifiers, each of which is operatively coupled to one or more of the bit lines BLs inside the memory array 120.

Figure 2:
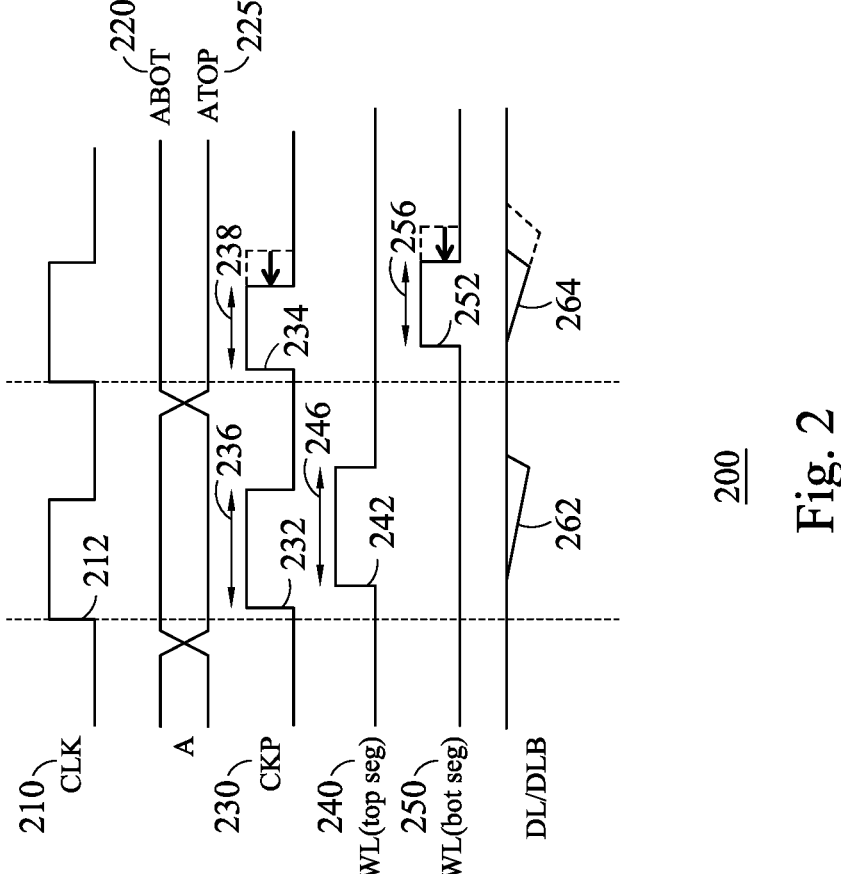
FIG. 2 illustrates waveforms of various signals associated with operation of an example memory device, in accordance with various embodiments.

FIG. 2 illustrates waveforms 200 of various signals associated with operation of an example memory device, in accordance with various embodiments. For example, the waveforms 200 may be associated with the memory device 100. Accordingly, the following discussion of the waveforms 200 may refer to some of the reference numerals used in FIG. 1 as a non-limiting example. Further, the waveforms 200 are merely illustrated as an example, and are not intended to limit the present disclosure.

A clock generator of the memory controller 105 can generate a clock signal (CLK) 210, and provide the CLK 210 for a pulse generator to generate a clock pulse (CKP) 230. As shown in FIG. 2, a rising edge 212 of the CLK 210 can be substantially synchronous with a rising edge 232 of the CKP 230. Responsive to the CLK 210 and/or the CKP 230, the memory controller 105 can assert a word line through a word line (WL) signal based on an address signal indicating the word line. For example, the memory controller 105 can receive an address signal ABOT 220 indicating a first word line, and assert the first word line through a WL signal 250. For example, the memory controller 105 can receive an address signal ATOP 225 indicating a second word line, and assert the second word line through a WL signal 240. As shown in FIG. 2, the rising edge 232 of the CKP 230 can be substantially synchronous with a rising edge 242 of the WL signal 240, and the rising edge 234 of the CKP 230 can be substantially synchronous with a rising edge 252 of the WL signal 250. Based on the WL signal 240 and the WL signal 250, corresponding data can be processed (e.g., read/write). For example, as shown in FIG. 2, a data line (DL) and a data line bar (DLB) can generate a DL signal 262 and a DLB signal 264 that each represent data bits (1 or 0) associated with a corresponding memory cell, according to the WL signal 240 and the WL signal 250, respectively.

The memory controller 105 can control one or more signals shown in the waveforms 200. In some examples, the memory controller 105 can control one or more signals shown in the waveforms 200 based on a physical location of a word line. The memory controller 105 can receive the address signal ATOP 225 indicating a first word line that is physically arranged with respect to the memory controller 105 by a first distance, and assert the first word line through the WL signal 250 with a first pulse width 256. For example, the WL signal 250 with the first pulse width 256 can be generated based on a corresponding portion of the CKP 230 with a first pulse width 238. The memory controller 105 can receive the address signal ABOT 220 indicating a second word line that is physically arranged with respect to the memory controller 105 by a second distance, and assert the second word line through the WL signal 240 with a second pulse width 246. For example, the WL signal 240 with the second pulse width 246 can be generated based on a corresponding portion of the CKP 230 with a second pulse width 236. The memory controller 105 can adjust one of the second pulse width 246 or the first pulse width 256 based on the first distance and the second distance (e.g., by adjusting the second pulse width 236 or the first pulse width 238 of the CKP 230). For example, when the first word line is located physically closer to the memory controller 105 than the second word line is (e.g., the first distance is shorter than the second distance), the memory controller 105 can adjust the first pulse width 238 of the CKP 230 (e.g., reduce the pulse width as shown), thereby asserting the first word line with the WL signal 250 with a shorter pulse width (e.g., the pulse width 256). As shown with the DLB signal 264 having a shortened pulse width, unnecessary consumption of power can be prevented for accessing the bit associated with the first word line.

Figure 3:
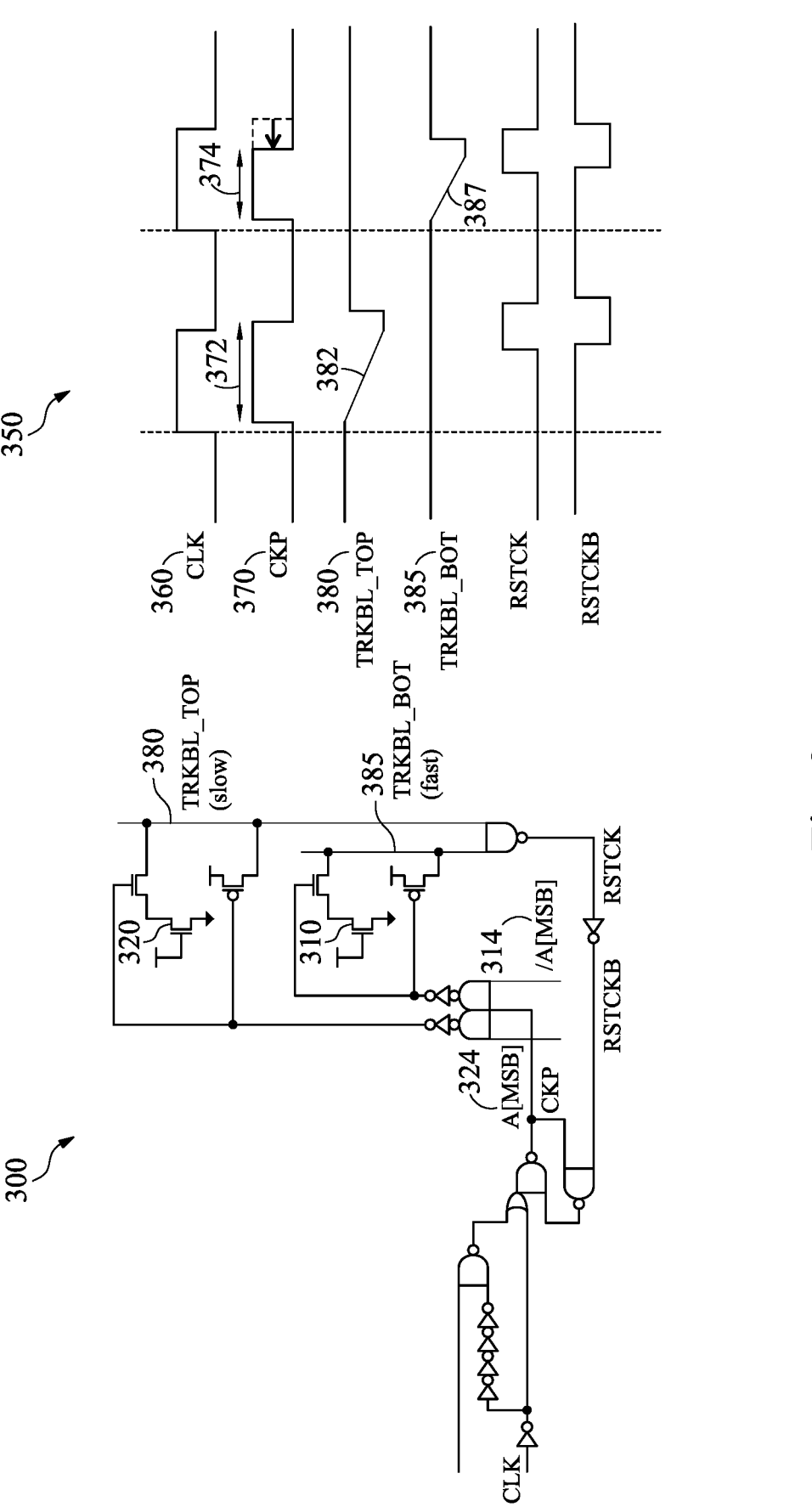
FIG. 3 illustrates an example circuit in the memory device and waveforms of various signals associated with operation of the circuit, in accordance with various embodiments.

FIG. 3 illustrates an example circuit 300 in the memory device 100 and waveforms 350 of various signals associated with operation of the circuit 300, in accordance with various embodiments. The circuit 300 may be a feature of the tracking columns 130 shown in FIG. 1.

As shown, the circuit 300 includes a plurality of tracking cells, including a first tracking cell 310 and a second tracking cell 320. The first tracking cell 310 may correspond to a first word line of a plurality of word lines, and the second tracking cell 320 may correspond to a second word line of the plurality of word lines. In some embodiments, each of the first tracking cell 310 and the second tracking cell 320 is located at a location physically corresponding to each of the first word line and the second word line, respectively. For example, the first word line and the first tracking cell 310 are located physically closer to the controller 105 than the second word line and the second tracking cell 320 are.

Referring to the waveforms 350, the circuit 300 can be controlled by the memory controller 105. The clock generator of the memory controller 105 can generate a CLK 360, and provide the CLK 360 for a pulse generator to generate a CKP 370. Responsive to the CLK 360 and/or the CKP 370, the memory controller 105 can assert a tracking cell through a tracking line signal based on an address signal indicating the tracking cell to be asserted. For example, the memory controller 105 can receive an address signal/A[MSB] (MSB: most significant bit) indicating the first tracking cell 310, and assert the first tracking cell 310 through a tracking line signal TRKBL_BOT 385. For example, the memory controller 105 can receive an address signal A[MSB] 324 indicating the second tracking cell 320, and assert the second tracking cell 320 through a tracking line signal TRKBL_TOP 380.

The memory controller 105 can control one or more signals shown in the waveforms 350. In some examples, the memory controller 105 can control one or more signals shown in the waveforms 350 based on a physical location of a tracking cell. The memory controller 105 can receive the address signal/A[MSB] 314 indicating the first tracking cell 310 that is physically arranged with respect to the memory controller 105 by a first distance, and assert the first tracking cell 310 through the TRKBL_BOT 385 with a first slope 387. For example, the TRKBL_BOT 385 with the first slope 387 can be generated based on a corresponding portion of the CKP 370 with a first pulse width 374. The memory controller 105 can receive the address signal A[MSB] 324 indicating the second tracking cell 320 that is physically arranged with respect to the memory controller 105 by a second distance, and assert the second tracking cell 320 through the tracking signal TRKBL_TOP 380 with a second slope 382. For example, the tracking signal TRKBL_TOP 380 with the second slope 382 can be generated based on a corresponding portion of the CKP 370 with a second pulse width 372. The memory controller 105 can adjust one of the first pulse width 374 or the second pulse width 372 based on the first distance and the second distance (e.g., by adjusting the pulse width 372 or the pulse width 374 of the CKP 370). For example, when the first tracking cell 310 is located physically closer to the memory controller 105 than the second tracking cell 320 is (e.g., the first distance is shorter than the second distance), the memory controller 105 can adjust the pulse width 374 of the CKP 370 (e.g., reduce the pulse width as shown), thereby asserting the first tracking cell 310 with the TRKBL_BOT 385 with the first slope 387.

Figure 4:
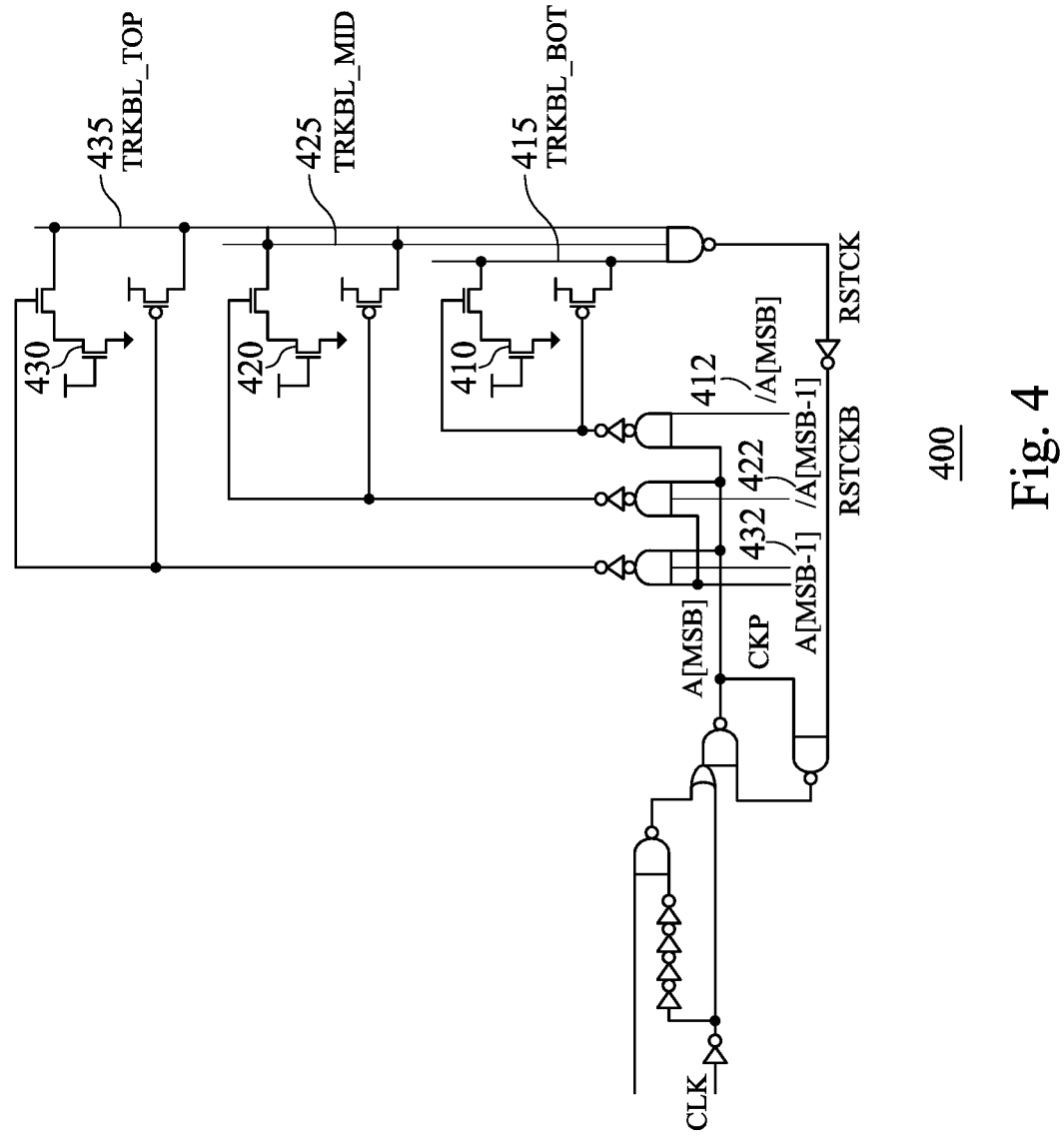
FIG. 4 illustrates an example circuit in the memory device, in accordance with various embodiments.

FIG. 4 illustrates an example circuit 400 in the memory device 100, in accordance with various embodiments. The circuit 400 may be a feature of the tracking columns 130.

As shown, the circuit 400 includes a plurality of tracking cells, including a first tracking cell 410, a second tracking cell 420, and a third tracking cell 430. The first tracking cell 410 may correspond to a first word line of a plurality of word lines, the second tracking cell 420 may correspond to a second word line of the plurality of word lines, and the third tracking cell 430 may correspond to a third word line of the plurality of word lines. In some embodiments, each of the first tracking cell 410, the second tracking cell 420, and the third tracking cell 430 is located at a location physically corresponding to each of the first word line, the second word line, and the third word line respectively. For example, the first word line and the first tracking cell 410 are located physically closer to the controller 105 than the second word line and the second tracking cell 320 are, and the second word line and the second tracking cell 420 are located physically closer to the controller 105 than the third word line and the third tracking cell 430 are.

The memory controller 105 can control a tracking line signal based on the physical locations of the tracking cells 410, 420, 430. The memory controller 105 can receive an address signal/A[MSB] 412 indicating the first tracking cell 410 that is physically arranged with respect to the memory controller 105 by a first distance, and assert the first tracking cell 410 through the TRKBL_BOT 415 with a first slope. For example, the TRKBL_BOT 415 with the first slope can be generated based on a corresponding clock pulse with a first pulse width. The memory controller 105 can receive an address signal/A[MSB-1] 422 indicating the second tracking cell 420 that is physically arranged with respect to the memory controller 105 by a second distance, and assert the second tracking cell 420 through the tracking signal TRKBL_MID 425 with a second slope. For example, the tracking signal TRKBL_MID 425 with the second slope can be generated based on a corresponding clock pulse with a second pulse width. The memory controller 105 can receive an address signal A[MSB-1] 432 indicating the third tracking cell 430 that is physically arranged with respect to the memory controller 105 by a third distance, and assert the third tracking cell 430 through the tracking signal TRKBL_TOP 435 with a third slope. For example, the tracking signal TRKBL_TOP 435 with the third slope can be generated based on a corresponding clock pulse with a third pulse width. The memory controller 105 can adjust the pulse widths (e.g., the first pulse width, the second pulse width, the third pulse width) and/or the slopes (e.g., the first slope, the second slope, the third slope) based on the physical locations of the tracking cells 410, 420, 430. In some embodiments, the pulse width of the clock pulse can be proportional to the distance between the memory controller 105 and the tracking cell. For example, the first pulse width for the first tracking cell 410 may be shorter than the second pulse width for the second tracking cell 420, and the second pulse width for the second tracking cell 420 may be shorter than the third pulse width for the third tracking cell 430. For example, the slope for the TRKBL_BOT 415 may be larger than the slope for the TRKBL_MID 425, and the slope for the TRKBL_MID 425 may be larger than the slope for the TRKBL_TOP 435. Although depicted with three logic tracking cells, the circuit 400 may include any number of tracking cells.

Figure 5:
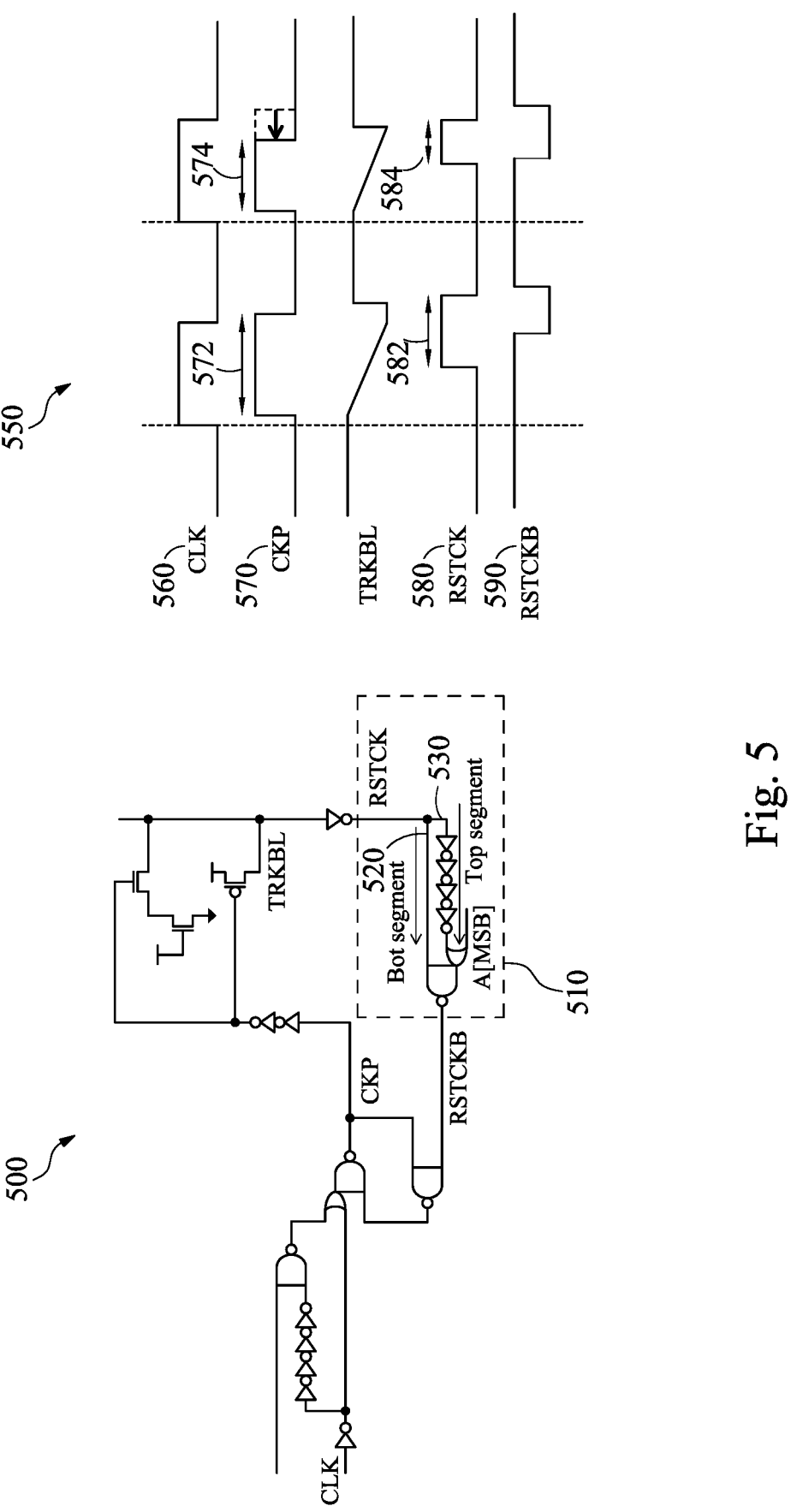
FIG. 5 illustrates an example circuit in the memory device and waveforms of various signals associated with operation of the circuit, in accordance with various embodiments.

FIG. 5 illustrates an example circuit 500 in the memory device 100 and waveforms 550 of various signals associated with operation of the circuit 500, in accordance with various embodiments. The circuit 500 may be a feature of the tracking columns 130.

The circuit 500 includes a delay circuit 510, including a first logic delay circuit 520 and a second logic delay circuit 530, configured to provide a logic delay and/or a reset signal. The first logic delay circuit 520 corresponds to a first word line and provides a first logic delay, and a first reset signal can be generated based on the first logic delay. The second logic delay circuit 530 corresponds to a second word line and provides a second logic delay, and a second reset signal can be generated based on the second logic delay.

Referring to the waveforms 550, the circuit 500 can be controlled by the memory controller 105. The clock generator of the memory controller 105 can generate a CLK 560, and provide the CLK 560 for a pulse generator to generate a CKP 570. Responsive to the CLK 560 and/or the CKP 570, the memory controller 105 can generate a reset signal RSTCKB 590. The reset signal RSTCKB 590 can be generated based on a signal RSTCK 580 and an address signal indicating a corresponding word line.

The memory controller 105 can control one or more signals shown in the waveforms 550 based on a physical location of a word line. The memory controller 105 can receive a first address signal indicating a first word line that is physically arranged with respect to the memory controller 105 by a first distance and a second address signal indicating a second word line that is physically arranged with respect to the memory controller 105 by a second distance. Based on the first distance and the second distance, the memory controller 105 can adjust a pulse width of the CKP 570. For example, as shown, when the second distance is larger than the first distance, the memory controller 105 can provide the CKP 570 with a pulse width 572 for the second word line and provide the CKP 570 with a pulse width 574 (shorter than the pulse width 572, as shown in FIG. 5) for the first word line. Responsive to the CKP 570, the circuit 500 can generate the RSTCK 580 with a first pulse width 584 for the first word line and the RSTCK 580 with a second pulse width 582 for the second word line.

The memory controller 105 can control the circuit 500 such that the RSTCK 580 can be transmitted through the delay circuit 510 based on the physical location of the word lines. For example, the memory controller 105 can control the circuit 500 for the RSTCK 580 with the pulse width 582 to be transmitted through the second logic delay circuit 530, and the memory controller 105 can control the circuit 500 for the RSTCK 580 with the pulse width 584 to be transmitted through the first logic delay circuit 520, thereby providing the RSTCKB 590.

Figure 6:
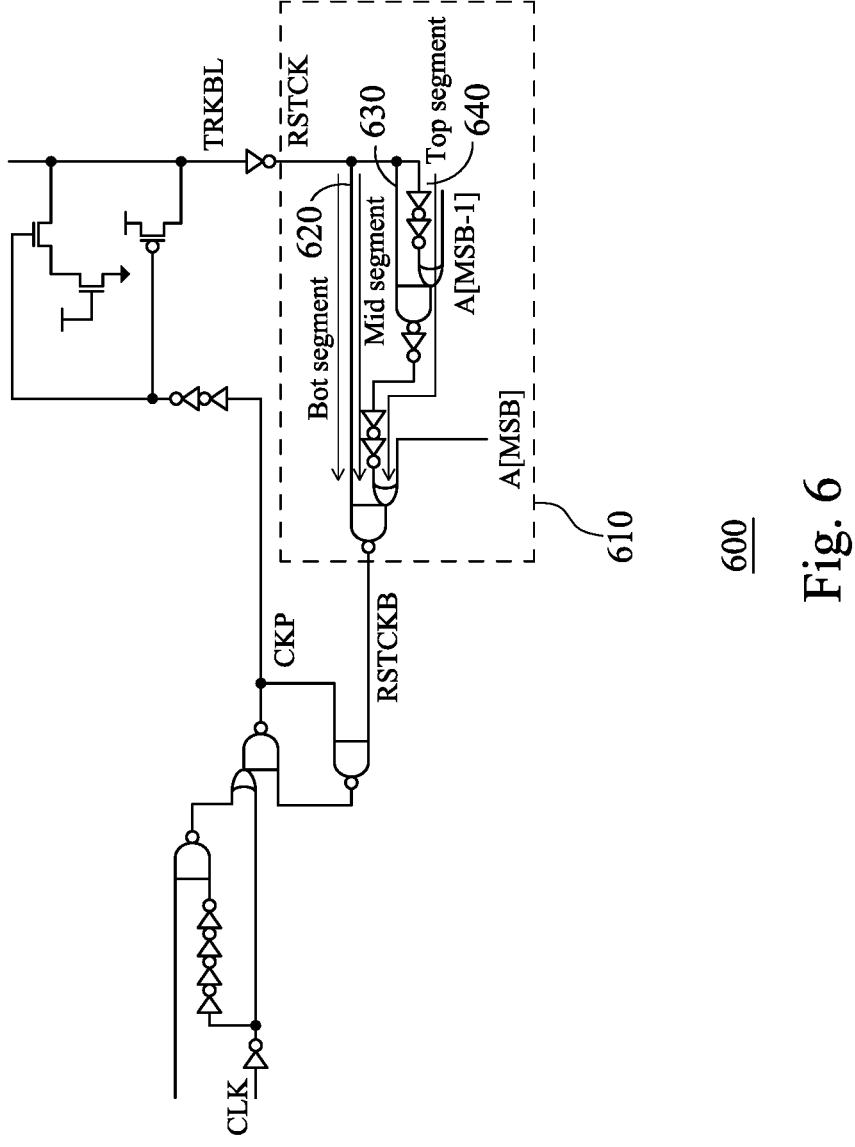
FIG. 6 illustrates an example circuit in the memory device, in accordance with various embodiments.

FIG. 6 illustrates an example circuit 600 in the memory device 100, in accordance with various embodiments. The circuit 600 may be a feature of the tracking columns 130.

As shown, the circuit 600 includes a delay circuit 610, including a first logic delay circuit 620, a second logic delay circuit 630, and a third logic delay circuit 640. The first logic delay circuit 620 may correspond to a first word line of a plurality of word lines, the second logic delay circuit 630 may correspond to a second word line of the plurality of word lines, and the third logic delay circuit 640 may correspond to a third word line of the plurality of word lines. In some embodiments, each of the first logic delay circuit 620, the second logic delay circuit 630, and the third logic delay circuit 640 provides a logic delay and a reset signal corresponding to a physical location of each of the first word line, the second word line, and the third word line, respectively. For example, when the first word line is located at a first distance from the memory controller 105, the second word line is located at a second distance from the memory controller 105, the third word line is located at a third distance from the memory controller 105, and the third distance is larger than the second distance, and the second distance is larger than the first distance, the memory controller 105 can provide a signal RSTCK with a first pulse width for the first word line, provide the RSTCK with a second pulse width for the second word line, and provide the RSTCK with a third pulse width for the third word line, where the third pulse width is larger than the second pulse width, and the second pulse width is larger than the first pulse width. Based on the RSTCK, the memory controller 105 can generate a RSTCKB through the first logic delay circuit 620 for the first word line, through the second logic delay circuit 630 for the second word line, and through the third logic delay circuit 640 for the third word line. Although depicted with three logic delay circuits, the circuit 600 may include any number of logic delay circuits.

Figure 7B:
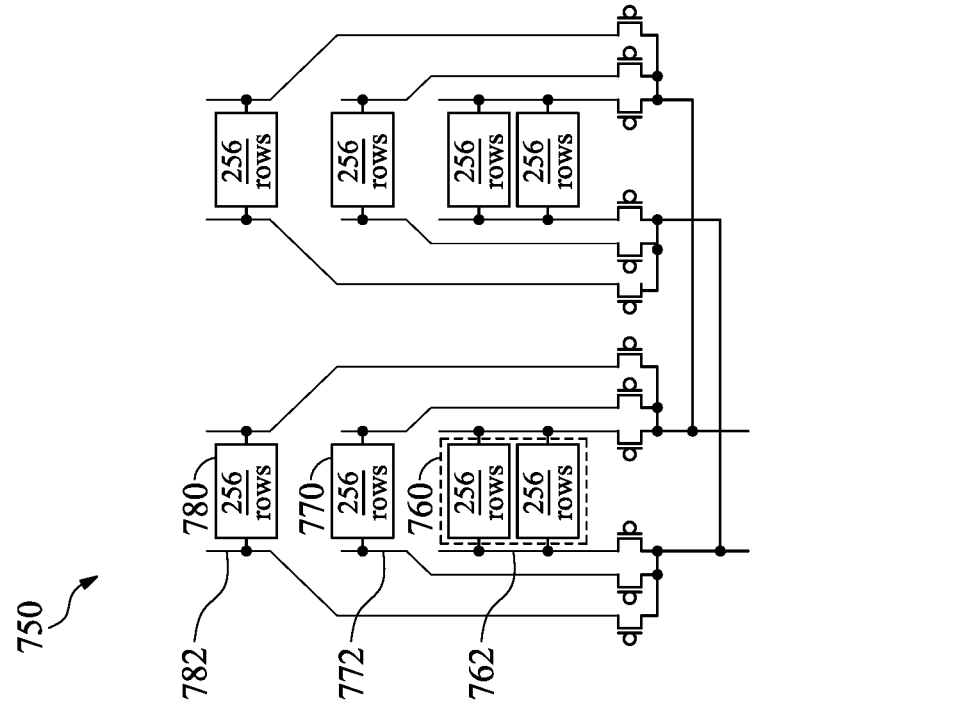
FIGS. 7A, 7B illustrate example circuits in the memory device, in accordance with various embodiments.
Figure 7A:
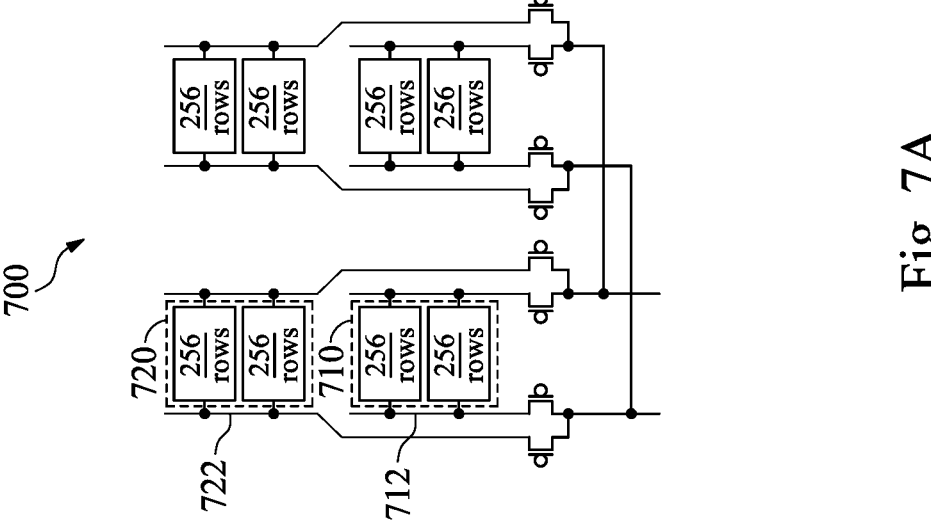

FIG. 7A illustrates an example circuit 700 in the memory device 100, in accordance with various embodiments. The circuit 700 may be a feature of the memory device 100. FIG. 7B illustrates an example circuit 750 in the memory device 100, in accordance with various embodiments. The circuit 750 may be a feature of the memory device 100.

As shown, the circuit 700 includes a plurality of rows of memory cells, including a first set of rows 710 and a second set of rows 720. The memory controller 105 can control a WL signal provided to each of the first set of rows 710 and the second set of rows 720, based on physical locations of the first set of rows 710 and the second set of rows 720.

Responsive to a clock signal (e.g., CLK 210) and/or a clock pulse (e.g., CKP 230), the memory controller 105 can assert a set of rows through a WL signal based on an address signal indicating the set of rows. For example, the memory controller 105 can receive a first address signal indicating the first set of rows 710, and assert the first set of rows 710 with a first WL signal through a first segment 712. For example, the memory controller 105 can receive a second address signal indicating the second set of rows 720, and assert the second set of rows 720 with a second WL signal through a second segment 722. As shown, the first set of rows 710 is located closer to the memory controller 105 than the second set of 720 is (e.g., the first segment 712 is shorter than the second segment 722). Based on this difference in the location of the memory cells, the memory controller 105 can adjust a pulse width of the clock pulse (e.g., shorten the pulse width of the clock pulse corresponding to the first set of rows 710), thereby asserting the first set of rows with a shorter pulse width (e.g., the pulse width 256). This prevents unnecessary consumption of power for accessing the bit associated with the first set of rows 710.

Referring to FIG. 7B, the circuit 750 includes a plurality of rows of memory cells, including a first set of rows 760, a second set of rows 770, and a third set of rows 780. The memory controller 105 can control a WL signal provided to each of plurality of rows of memory cells, based on physical locations of the memory cells.

Responsive to a clock signal (e.g., CLK 210) and/or a clock pulse (e.g., CKP 230), the memory controller 105 can assert a set of rows through a WL signal based on an address signal indicating the set of rows. For example, the memory controller 105 can receive a first address signal indicating the first set of rows 760, and assert the first set of rows 760 with a first WL signal through a first segment 762. For example, the memory controller 105 can receive a second address signal indicating the second set of rows 770, and assert the second set of rows 770 with a second WL signal through a second segment 772. For example, the memory controller 105 can receive a third address signal indicating the third set of rows 780, and assert the third set of rows 780 with a third WL signal through a third segment 782. As shown, the first set of rows 760 is located closer to the memory controller 105 than the second set of 770 is (e.g., the first segment 762 is shorter than the second segment 772), and the second set of rows 770 is located closer to the memory controller 105 than the third set of rows 780 is (e.g., the second segment 772 is shorter than the third segment 782). Based on this difference in the location of the memory cells, the memory controller 105 can adjust a pulse width of the clock pulse (e.g., adjust the pulse width of the clock pulse to be proportional to the physical locations and/or the length of the segments 762, 772, 782), thereby asserting each of the plurality of rows of memory cells with a different pulse width (e.g., shortened for the first set of rows 760, such as the pulse width 256). This prevents unnecessary consumption of power for accessing the bit associated with the first set of rows 760. In some embodiments, the timing can be tuned by a tracking bit line and/or a gate delay.

Figures 8A, 8B:
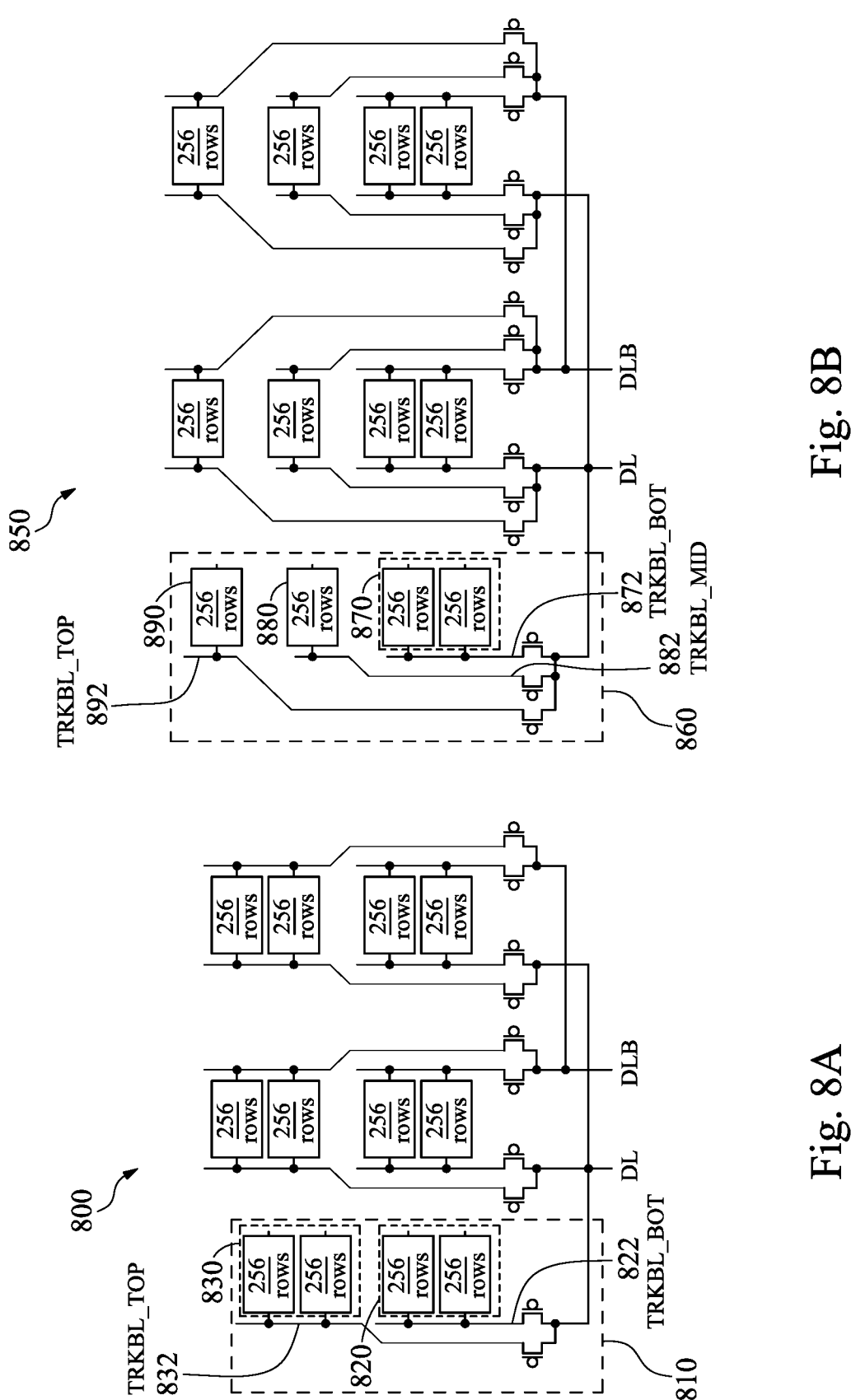
FIGS. 8A, 8B illustrate example circuits in the memory device, in accordance with various embodiments.

FIG. 8A illustrates an example circuit 800 in the memory device 100, in accordance with various embodiments. The circuit 800 may be incorporate features of the circuit 700. For example, the circuit 800 additionally includes a tracking circuit 810. FIG. 8B illustrates an example circuit 850 in the memory device 100, in accordance with various embodiments. The circuit 850 may be or incorporate features of the circuit 750. For example, the circuit 850 additionally includes a tracking circuit 860.

Referring to FIG. 8A, the tracking circuit 810 includes a plurality of rows of tracking arrays, including a first set of rows of tracking arrays 820 and a second set of rows of tracking arrays 830. The first set of rows of tracking arrays 820 may correspond to the first set of rows 710 (of the memory cells), and the second set of rows of tracking arrays 830 may correspond to the second set of rows 720 (of the memory cells). In some embodiments, each of the first set of rows of tracking arrays 820 and the second set of rows of tracking arrays 830 is located at a location physically corresponding to each of the first set of rows 710 and the second set of rows 720, respectively. For example, when the first set of rows 710 is closer to the memory controller 105 than the second set of rows 720 is, the first set of rows of tracking arrays 820 is closer to the memory controller 105 than the second set of rows of tracking arrays 830.

The memory controller 105 can control a tracking signal based on a physical location of a set of rows of tracking arrays. The memory controller 105 can receive a first address signal indicating the first set of rows of tracking arrays 820 that is physically arranged with respect to the memory controller 105 by a first distance, and assert the first set of rows of tracking arrays 820 through a tracking signal TRKBL_BOT 822 with a first slope and/or a first pulse width. For example, the TRKBL_BOT 822 with the first slope and/or the first pulse width can be generated based on a corresponding clock pulse with a first clock pulse width. The memory controller 105 can receive a second address signal indicating the second set of rows of tracking arrays 830 that is physically arranged with respect to the memory controller 105 by a second distance, and assert the second set of rows of tracking arrays 830 through a tracking signal TRKBL_TOP 832 with a second slope and/or a second pulse width. For example, the TRKBL_TOP 832 with the second slope and/or the second pulse width can be generated based on a corresponding clock pulse with a second clock pulse width. The memory controller 105 can adjust one of the first clock pulse width or the second clock pulse width based on the first distance and the second distance (e.g., adjusting the pulse width 372 or the pulse width 374 of the CKP 370). For example, when the first set of rows of tracking arrays 820 is located physically closer to the memory controller 105 than the second set of rows of tracking arrays 830 is, as shown (e.g., the first distance is shorter than the second distance), the memory controller 105 can adjust the first clock pulse width (e.g., reduce the pulse width), thereby asserting the first set of rows of tracking arrays 820 with the TRKBL_BOT 822 with the first slope and/or the first pulse width shorter than the second pulse width.

Referring to FIG. 8B, the tracking circuit 860 includes a plurality of rows of tracking arrays, including a first set of rows of tracking arrays 870, a second set of rows of tracking arrays 880, and a third set of rows of tracking arrays 890. The first set of rows of tracking arrays 870 may correspond to the first set of rows 760 (of the memory cells), the second set of rows of tracking arrays 880 may correspond to the second set of rows 770 (of the memory cells), and the third set of rows of tracking arrays 830 may correspond to the third set of rows 780 (of the memory cells). In some embodiments, each of the first set of rows of tracking arrays 870, the second set of rows of tracking arrays 880, and the third set of rows of tracking arrays 890 is located at a location physically corresponding to each of the first set of rows 760, the second set of rows 770, and the third set of rows 780, respectively. For example, when the first set of rows 760 is closer to the memory controller 105 than the second set of rows 770 is, the first set of rows of tracking arrays 870 is closer to the memory controller 105 than the second set of rows of tracking arrays 880. When the second set of rows 770 is closer to the memory controller 105 than the third set of rows 780 is, the second set of rows of tracking arrays 880 is closer to the memory controller 105 than the third set of rows of tracking arrays 890.

The memory controller 105 can control a tracking signal based on a physical location of a set of rows of tracking arrays. The memory controller 105 can receive a first address signal indicating the first set of rows of tracking arrays 870 that is physically arranged with respect to the memory controller 105 by a first distance, and assert the first set of rows of tracking arrays 870 through a tracking signal TRKBL_BOT 872 with a first slope and/or a first pulse width. For example, the TRKBL_BOT 872 with the first slope and/or the first pulse width can be generated based on a corresponding clock pulse with a first clock pulse width. The memory controller 105 can receive a second address signal indicating the second set of rows of tracking arrays 880 that is physically arranged with respect to the memory controller 105 by a second distance, and assert the second set of rows of tracking arrays 880 through a tracking signal TRKBL_MID 882 with a second slope and/or a second pulse width. For example, the TRKBL_MID 882 with the second slope and/or the second pulse width can be generated based on a corresponding clock pulse with a second clock pulse width. The memory controller 105 can receive a third address signal indicating the third set of rows of tracking arrays 890 that is physically arranged with respect to the memory controller 105 by a third distance, and assert the third set of rows of tracking arrays 890 through a tracking signal TRKBL_TOP 892 with a third slope and/or a third pulse width. For example, the TRKBL_TOP 892 with the third slope and/or the third pulse width can be generated based on a corresponding clock pulse with a third clock pulse width.

The memory controller 105 can adjust at least one of the first clock pulse width, the second clock pulse width, or the third clock pulse width based on the first distance, the second distance, and the third distance. For example, when the first set of rows of tracking arrays 870 is located physically closer to the memory controller 105 than the second set of rows of tracking arrays 880 is, as shown (e.g., the first distance is shorter than the second distance), the memory controller 105 can adjust the first clock pulse width (e.g., reduce the pulse width), thereby asserting the first set of rows of tracking arrays 870 with the TRKBL_BOT 872 with the first slope and/or the first pulse width shorter than the second pulse width. When the second set of rows of tracking arrays 880 is located physically closer to the memory controller 105 than the third set of rows of tracking arrays 890 is, as shown (e.g., the second distance is shorter than the third distance), the memory controller 105 can adjust the second clock pulse width (e.g., reduce the pulse width), thereby asserting the second set of rows of tracking arrays 880 with the TRKBL_MID 882 with the second slope and/or the second pulse width shorter than the third pulse width.

FIG. 9 illustrates a flow chart of an example method 900 for operating a memory device (e.g., the memory device 100 of FIG. 1), in accordance with some embodiments. The method 900 may be performed by a memory controller (e.g., the memory controller 105 of FIG. 1). It is noted that the method 900 is merely an example and is not intended to limit the present disclosure. Accordingly, it is understood that additional operations may be provided before, during, and after the method 900 of FIG. 9, and that some other operations may only be briefly described herein.

In a brief overview, the method 900 starts with operation 910 of receiving, by a controller (e.g., the memory controller 105), a first address signal (e.g., the first address signal 220) indicating a first one of a plurality of word lines of a memory array (e.g., the memory array 120). The method 900 continues to operation 920 of asserting, by the controller, the first word line through a first signal (e.g., the first signal 250) with a first pulse width (e.g., the pulse width 256). The method 900 continues to operation 930 of receiving, by the controller, a second address signal (e.g., the second address signal 225) indicating a second one of the plurality of word lines of the memory array. The method 900 continues to operation 940 of asserting, by the controller, the second word line through a second signal (e.g., the second signal 240) with a second pulse width (e.g., the second pulse width 246). The method 900 continues to operation 950 of adjusting, by the controller, one of the first pulse width or the second pulse width in response to an identification that the first word line is located physically closer to the controller than the second word line is.

At operation 910, the memory controller can receive an address signal indicating one or more of word lines. The memory controller can identify a physical location of the one or more of word lines. For example, the memory controller can identify a relative location of the one or more of word lines. For example, the memory controller can identify one of word lines is located physically closer to the memory controller than another one of word lines is.

At operation 920, the memory controller can assert a first word line through a first word line signal with a first pulse width. In some embodiments, operation 920 may include operation 950 of adjusting a pulse width of a word line signal. The memory controller can adjust the pulse width of the first word line signal in response to receiving the address signal. For example, the memory controller can adjust (e.g., shorten) the pulse width of the first word line signal in response to identifying that the first word line is located closer to the memory controller than at least one of word lines is.

At operation 930, the memory controller can receive an address signal indicating one or more of word lines. The memory controller can identify a physical location of the one or more of word lines. For example, the memory controller can identify a relative location of the one or more of word lines. For example, the memory controller can identify one of word lines is located physically closer to the memory controller than another one of word lines is. In some embodiments, operation 930 may be substantially similar or identical to operation 910.

At operation 940, the memory controller can assert a second word line through a second word line signal with a second pulse width. In some embodiments, operation 940 may include operation 950 of adjusting a pulse width of a word line signal. The memory controller can adjust the pulse width of the second word line signal in response to receiving the address signal. For example, the memory controller can adjust (e.g., shorten) the pulse width of the second word line signal in response to identifying that the second word line is located closer to the memory controller than at least one of word lines is.

At operation 950, the memory controller can adjust a pulse width of a corresponding word line signal for at least one of the one or more word lines. The memory controller can adjust a pulse width of a clock pulse to adjust the pulse width of the corresponding word line signal. For example, the memory controller can adjust (e.g., shorten) the pulse width of the corresponding word line signal in response to identifying that the corresponding word line is located closer to the memory controller than at least one of word lines is. In some embodiments, the memory controller can adjust a pulse slope (e.g., 387) and/or a pulse width of a tracking line signal (e.g., 385) based on the physical location of the corresponding tracking cell (e.g., 310). In some embodiments, the memory controller can adjust a logic delay and a pulse width (e.g., 584) of a reset signal (e.g., 580, 590) based on the physical location of the corresponding word line.

In one aspect of the present disclosure, a memory device is disclosed. The memory device includes a memory array including a plurality of word lines, each of the plurality of word lines operatively coupled to a corresponding set of memory cells; and a controller operatively coupled to the memory array. The controller is configured to receive a first address signal indicating a first word line that is physically arranged with respect to the controller by a first distance; assert the first word line through a first signal with a first pulse width; receive a second address signal indicating a second word line that is physically arranged with respect to the controller by a second distance; assert the second word line through a second signal with a second pulse width; and adjust one of the first pulse width or the second pulse width based on the first distance and the second distance.

In another aspect of the present disclosure, a memory device is disclosed. The memory device includes a memory array including a plurality of word lines, each of the plurality of word lines operatively coupled to a corresponding set of memory cells; and a controller operatively coupled to the memory array. The controller is configured to assert a first word line through a first signal according to a first address signal; assert a second word line through a second signal according to a second address signal; based at least in part on the first address signal and the second address signal, identify a difference in a physical location between the first word line and the second word line; and in response to a determination that at least one of the first word line or the second word line is within a predetermined distance from the controller, adjust a pulse width of at least one of the first signal or the second signal.

In yet another aspect of the present disclosure, a method for operating memory devices is disclosed. The method includes receiving, by a controller, a first address signal indicating a first one of a plurality of word lines of a memory array; asserting, by the controller, the first word line through a first signal with a first pulse width; receiving, by the controller, a second address signal indicating a second one of the plurality of word lines of the memory array; asserting, by the controller, the second word line through a second signal with a second pulse width; and adjusting, by the controller, one of the first pulse width or the second pulse width in response to an identification that the first word line is located physically closer to the controller than the second word line is.

As used herein, the terms "about" and "approximately" generally indicates the value of a given quantity that can vary based on a particular technology node associated with the subject semiconductor device. Based on the particular technology node, the term "about" can indicate a value of a given quantity that varies within, for example, 10-30% of the value (e.g., +10%, ±20%, or ±30% of the value).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
a memory array comprising a plurality of word lines, each of the plurality of word lines operatively coupled to a corresponding set of memory cells; and
a controller operatively coupled to the memory array, wherein the controller is configured to:
receive a first address signal associated with a first word line that is physically arranged with respect to the controller by a first distance, the first address signal indicating the first distance or a first physical location of the first word line;
assert the first word line through a first signal with a first pulse width;
receive a second address signal associated with a second word line that is physically arranged with respect to the controller by a second distance, the second address signal indicating the second distance or a second physical location of the second word line;
assert the second word line through a second signal with a second pulse width; and
adjust, based on (i) the first address signal indicating the first physical location or first location and (ii) the second address signal indicating the second physical location or second location, one of the first pulse width or the second pulse width.

2. The memory device of claim 1, wherein the controller is configured to reduce the first pulse width, in response to identifying that the first word line is located physically closer to the controller than the second word line is.

3. The memory device of claim 1, wherein the first pulse width is shorter than the second pulse width, and the first distance is shorter than the second distance.

4. The memory device of claim 1, wherein the controller is configured to adjust the one of the first pulse width or the second pulse width by adjusting one of a pulse width of a first clock pulse associated with the first signal or a pulse width of a second clock pulse associated with the second signal.

5. The memory device of claim 1, further comprising:
a first tracking cell of a plurality of tracking cells, the first tracking cell corresponding to the first word line; and
a second tracking cell of the plurality of tracking cells, the second tracking cell corresponding to the second word line;
wherein the first tracking cell and the second tracking cell are physically located corresponding to the first word line and the second word line, respectively.

6. The memory device of claim 5, wherein the controller is configured to:
assert the first tracking cell through a first tracking signal according to the first address signal;
assert the second tracking cell through a second tracking signal according to the second address signal; and
adjust a pulse width of one of the first tracking signal or the second tracking signal based on the first address signal and the second address signal.

7. The memory device of claim 6, wherein the first tracking signal has a first slope and the second tracking signal has a second slope, the second slope larger than the first slope.

8. The memory device of claim 1, further comprising:
a first logic delay circuit corresponding to the first word line, the first logic delay circuit configured to provide a first reset signal; and
a second logic delay circuit corresponding to the second word line, the second logic delay circuit configured to provide a second reset signal;
wherein a length of one of the first reset signal or the second reset signal is adjusted according to the first distance and the second distance.

9. The memory device of claim 8, wherein the first distance is shorter than the second distance, and a pulse width of the first reset signal is shorter than a pulse width of the second reset signal.

10. A memory device, comprising:
a memory array comprising a plurality of word lines, each of the plurality of word lines operatively coupled to a corresponding set of memory cells; and
a controller operatively coupled to the memory array, wherein the controller is configured to:
assert a first word line through a first signal according to a first address signal indicating a first physical location of the first word line;
assert a second word line through a second signal according to a second address signal indicating a second physical location of the second word line;
based at least in part on the first address signal indicating the first physical location and the second address signal indicating the second physical location, identify a difference in a physical location between the first word line and the second word line; and in response to a determination that at least one of the first word line or the second word line is within a predetermined distance from the controller, adjust a pulse width of at least one of the first signal or the second signal based on the identified difference in the physical location.

11. The memory device of claim 10, wherein the controller is configured to reduce the pulse width of the first signal, based on the identified difference indicating the first word line is located physically closer to the controller than the second word line is.

12. The memory device of claim 10, wherein the controller is configured to adjust the pulse width of the at least one of the first signal or the second signal by adjusting one of a pulse width of a first clock pulse associated with the first signal or a pulse width of a second clock pulse associated with the second signal.

13. The memory device of claim 10, further comprising:
a first tracking cell of a plurality of tracking cells, the first tracking cell corresponding to the first word line; and
a second tracking cell of the plurality of tracking cells, the second tracking cell corresponding to the second word line;
wherein the first tracking cell and the second tracking cell are physically located corresponding to the first word line and the second word line, respectively.

14. The memory device of claim 13, wherein the controller is configured to:
assert the first tracking cell through a first tracking signal according to the first address signal;
assert the second tracking cell through a second tracking signal according to the second address signal; and
adjust a pulse width of one of the first tracking signal or the second tracking signal based on the identified difference.

15. The memory device of claim 14, wherein the first tracking signal has a first slope and the second tracking signal has a second slope, the second slope larger than the first slope.

16. The memory device of claim 10, further comprising:
a first logic delay circuit corresponding to the first word line, the first logic delay circuit configured to provide a first reset signal; and a second logic delay circuit corresponding to the second word line, the second logic delay circuit configured to provide a second reset signal;
wherein a pulse width of one of the first reset signal or the second reset signal is adjusted according to the identified difference.

17. The memory device of claim 16, wherein a pulse width of the first reset signal is shorter than a pulse width of the second reset signal.

18. A method for operating memory devices, comprising:
receiving, by a controller, a first address signal associated with a first one of a plurality of word lines of a memory array, the first address signal indicating a first physical location of the first one of the plurality of word lines;
asserting, by the controller, the first word line through a first signal with a first pulse width;
receiving, by the controller, a second address signal associated with a second one of the plurality of word lines of the memory array, the second address signal indicating a second physical location of the second one of the plurality of word lines;
asserting, by the controller, the second word line through a second signal with a second pulse width; and
adjusting, by the controller, based on the first address signal indicating the first physical location and the second address signal indicating the second physical location, one of the first pulse width or the second pulse width in response to an identification that the first word line is located physically closer to the controller than the second word line is.

19. The method of claim 18, further comprising:
adjusting, by the controller, one of a first pulse width of a first tracking signal or a second pulse width of a second tracking signal, in response to the identification that the first word line is located physically closer to the controller than the second word line is.

20. The method of claim 18, further comprising:
adjusting, by the controller, one of a first pulse width of a first reset signal or a second pulse width of a second reset signal, in response to the identification that the first word line is located physically closer to the controller than the second word line is.

* * * * *